United States Patent
Cho et al.

(10) Patent No.: US 6,460,269 B2
(45) Date of Patent: Oct. 8, 2002

(54) WAFER DRYER COMPRISING REVOLVING SPRAY NOZZLE AND METHOD FOR DRYING WAFERS USING THE SAME

(75) Inventors: Yong-joon Cho, Seoul (KR); Gyu-hwan Kwag, Kyungki-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/800,144

(22) Filed: Mar. 6, 2001

(65) Prior Publication Data

US 2001/0025428 A1 Oct. 4, 2001

(30) Foreign Application Priority Data

Mar. 22, 2000 (KR) .......................... 2000-14552

(51) Int. Cl.[7] .............................. F26B 3/00; F26B 5/08
(52) U.S. Cl. ................. 34/58; 34/59; 34/443; 34/499; 34/404; 34/314; 34/315; 34/317; 34/318; 34/351; 34/340
(58) Field of Search ................ 34/92, 58, 59, 34/443, 498, 499, 406, 402, 403, 404, 364, 312, 313, 314, 315, 317, 318, 319, 320, 321, 351, 343, 348, 326, 327, 340

(56) References Cited

U.S. PATENT DOCUMENTS

| | | | | |
|---|---|---|---|---|
| 3,990,462 A | * | 11/1976 | Elftmann et al. | 134/102 |
| 4,132,567 A | * | 1/1979 | Blackwood | 134/1 |
| 4,197,000 A | * | 4/1980 | Blackwood | 354/323 |
| 4,219,110 A | * | 8/1980 | Ubakata | 198/380 |
| 4,989,345 A | * | 2/1991 | Gill | 34/58 |
| 5,435,075 A | * | 7/1995 | Shiraishi et al. | 34/58 |
| 5,667,535 A | * | 9/1997 | Kasahara | 29/25.01 |
| 5,829,156 A | * | 11/1998 | Shibasaki et al. | 34/58 |
| 5,884,412 A | * | 3/1999 | Tietz et al. | 34/58 |
| 6,122,837 A | * | 9/2000 | Olesen et al. | 34/315 |
| 6,199,298 B1 | * | 3/2001 | Bergman | 34/315 |
| 6,253,462 B1 | * | 7/2001 | Schwarz | 34/348 |
| 6,286,524 B1 | * | 9/2001 | Okuchi et al. | 134/95.2 |

* cited by examiner

Primary Examiner—Ira S. Lazarus
Assistant Examiner—K. B. Rinehart
(74) Attorney, Agent, or Firm—Myers Bigel Sibley & Sajovec

(57) ABSTRACT

A wafer dryer for drying a wafer includes a chamber and a support adapted to support the wafer in the chamber. A spray nozzle is disposed in the chamber. A source gas supply tank is in fluid communication with the spray nozzle. At least one heater is operable to heat the chamber and the source gas supply tank. A pumping line is in fluid communication with the chamber. Drive means are operable to rotate the chamber and the spray nozzle. A method for drying a wafer using a wafer dryer including a chamber and a revolving spray nozzle includes the steps of: loading the wafer in the chamber; reducing the pressure in the chamber in which the wafer is loaded to a near vacuum state; creating a temperature controlled atmosphere in the pressure-reduced chamber to quicken drying of the wafer; and spraying the source gas on the wafer while rotating the chamber and the revolving spray nozzle in opposite directions in the pressure-reduced temperature controlled atmosphere.

31 Claims, 5 Drawing Sheets

WAFER DRYER COMPRISING REVOLVING SPRAY NOZZLE AND METHOD FOR DRYING WAFERS USING THE SAME

CROSS-REFERENCE TO RELATED APPLICATIONS

This application claims priority to Korean Application No. 00-14552, filed Mar. 22, 2000, the disclosure of which is hereby incorporated herein by reference.

FIELD OF THE INVENTION

The present invention relates to wafer dryers and methods for drying wafers, and more particularly, to spin dryers for drying wafers and methods for using the same.

BACKGROUND OF THE INVENTION

In a known method for drying a wafer such as a silicon wafer, the wafer is rotated at a high speed using a spin dryer to remove moisture from the surface of the wafer. Friction induced deterioration of high speed spinning parts of the spin dryer may generate particles. Also, particles which are removed from the wafer may be re-absorbed onto the wafer by static electricity induced by friction. Moreover, water marks may remain on the wafer in hydrophobic portions thereof after moisture is removed by the high speed rotation.

A widely used method for drying wafers larger than 8" includes vaporizing isopropyl alcohol (IPA), which is hydrophilic and highly volatile, and removing moisture using the vapor. This method may provide a simple means for drying the wafer. However, reaction by-products such as particles (e.g., silica) may be formed and coagulate on the wafer, leaving smears on the wafer. The particles may hamper the stability of follow-up processes. For example, locations where metal interconnections should be separated may be bridged by these particles, and intended connections may be broken by these particles. Moreover, as the diameter of the wafer is increased from 8" to 12", it becomes difficult to uniformly dry the entire wafer using only the isopropyl alcohol vapor.

SUMMARY OF THE INVENTION

According to embodiments of the present invention, a wafer dryer for drying a wafer includes a chamber and a support adapted to support the wafer in the chamber. A spray nozzle is disposed in the chamber. A source gas supply tank is in fluid communication with the spray nozzle. At least one heater is operable to heat the chamber and the source gas supply tank. A pumping line is in fluid communication with the chamber. Drive means are operable to rotate the chamber and the spray nozzle.

The drive means may be operable to rotate the chamber and the spray nozzle in opposite directions relative to one another. The at least one heater may include an external heater surrounding an upper portion of the chamber and operable to heat the chamber, and an internal heater mounted below the source gas supply tank and operable to heat the source gas supply tank. The wafer dryer may further include a fixed base and the drive means may include a chamber revolving unit operable to rotate the chamber about the fixed base, and a nozzle revolving unit operable to rotate the spray nozzle independently of the chamber.

According to further embodiments of the present invention, a wafer dryer for use with a wafer loading means includes a revolving chamber having a wall. The chamber has an interior and an exterior. A support is mounted on an upper part of the wall of the chamber. The support is adapted to support the wafer loading means in the chamber. An external heater surrounds an upper portion of the exterior of the chamber and is operable to heat the chamber. A revolving spray nozzle is disposed in the chamber and has a lower end. A source gas supply tank is connected to the lower end of the revolving spray nozzle by a source gas supply pipe. An internal heater is mounted below the source gas supply tank and is operable to heat the source gas supply tank. A fixed base is disposed below the internal heater. A pumping line passes through the fixed base. A chamber revolving unit is operable to rotate the chamber about the fixed base.

According to method embodiments of the present invention, a method for drying a wafer using a wafer dryer including a chamber and a revolving spray nozzle is provided. The method includes loading the wafer in the chamber. The pressure in the chamber in which the wafer is loaded is reduced to a near vacuum state. A temperature controlled atmosphere is created in the pressure-reduced chamber to quicken drying of the wafer. A source gas is sprayed on the wafer while rotating the chamber and the revolving spray nozzle in opposite directions in the pressure-reduced temperature controlled atmosphere.

Objects of the present invention will be appreciated by those of ordinary skill in the art from a reading of the figures and the detailed description of the preferred embodiments which follow, such description being merely illustrative of the present invention.

BRIEF DESCRIPTION OF THE DRAWINGS

The accompanying drawings, which are incorporated in and constitute a part of the specification, illustrate embodiments of the invention and, together with the description, serve to explain principles of the invention.

DETAILED DESCRIPTION OF THE PREFERRED EMBODIMENTS

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout. Elements of the drawings may be exaggerated for clarity.

Figure 1:
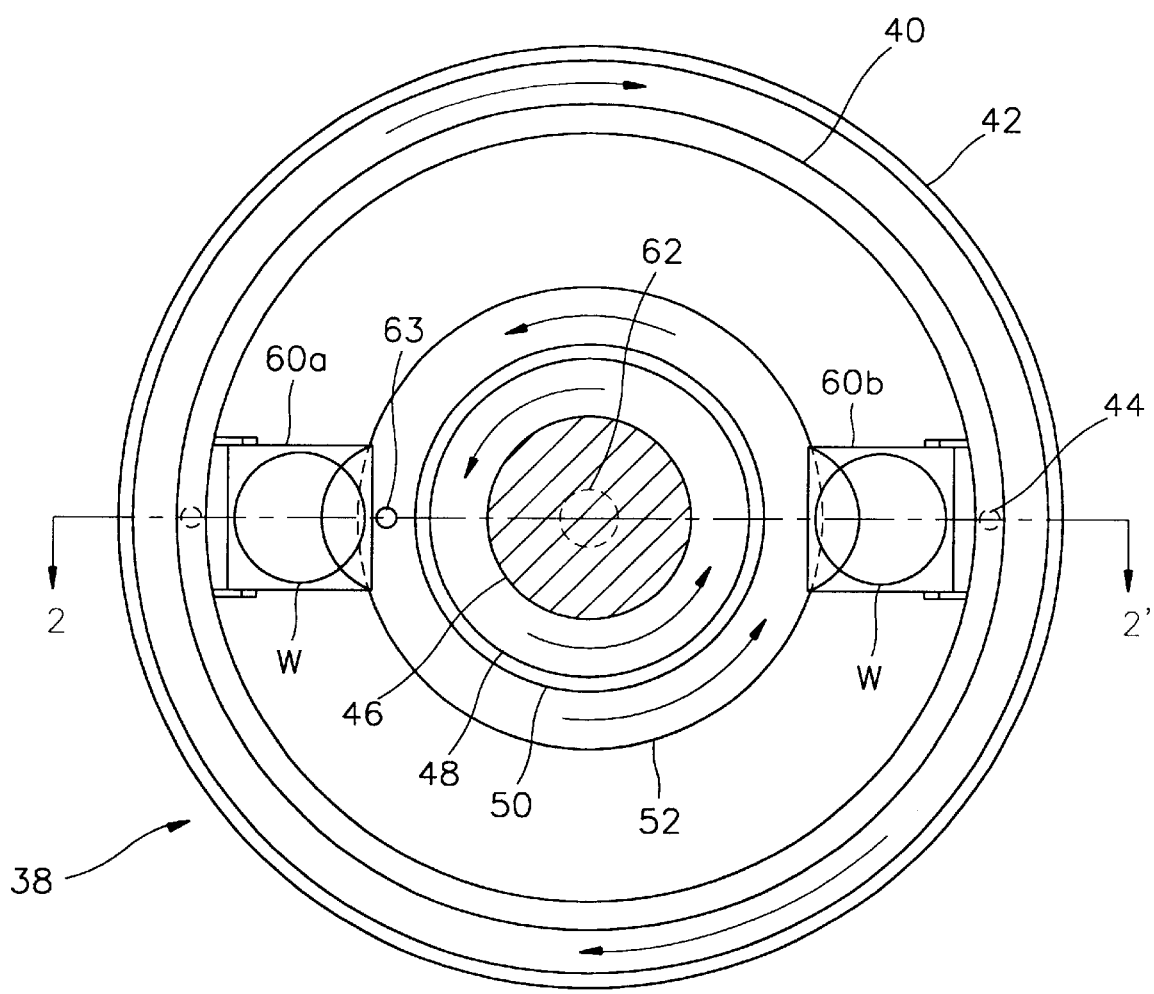
FIG. 1 is a top plan view of a wafer dryer according to the present invention.

With reference to FIG. 1, a wafer dryer 38 according to embodiments of the present invention is shown therein. The wafer dryer 38 includes a chamber 40 within which wafer drying is performed. An external heater 42 surrounds the chamber 40. The external heater 42 is operable to create an atmosphere of an appropriate temperature inside of the chamber 40, so that a source gas for vaporizing supplied to the inside of the chamber 40 is maintained in a vaporized state. More particularly, the external heater 42 heats the interior of the chamber 40 (primarily an upper portion) so as to create an atmosphere of a predetermined temperature. The temperature controlled atmosphere maintains the source gas in a vaporized state to quicken the reaction of the source gas with moisture on one or more wafers W disposed in the chamber 40. A revolving spray nozzle 46 and a source gas supply tank 48 connected to the revolving spray nozzle are mounted in the chamber 40. A revolving plate 50 transfers revolving power, which is generated from a fixed base 52 mounted in the middle of the chamber 40, to the source gas supply tank 48. The revolving plate 50, the source gas supply tank 48, and the revolving spray nozzle 46 are rotated in the same direction as indicated by arrows in FIG. 1.

First and second wafer loading means 60a and 60b are connected to the inner wall of the chamber 40. Preferably, and as illustrated and hereinafter referred to, the first and second wafer loading means 60a and 60b are wafer cassettes. A plurality of wafers W are held in each of the wafer cassettes 60a, 60b. The wafer cassettes 60a, 60b are mounted between the inner wall of the chamber 40 and the revolving spray nozzle 46. In use, the chamber 40 rotates in a direction opposite the direction of rotation of the spray nozzle 46. As a result, the first and second wafer cassettes 60a and 60b are rotated in the opposite direction to the revolving spray nozzle 46.

Figure 2:
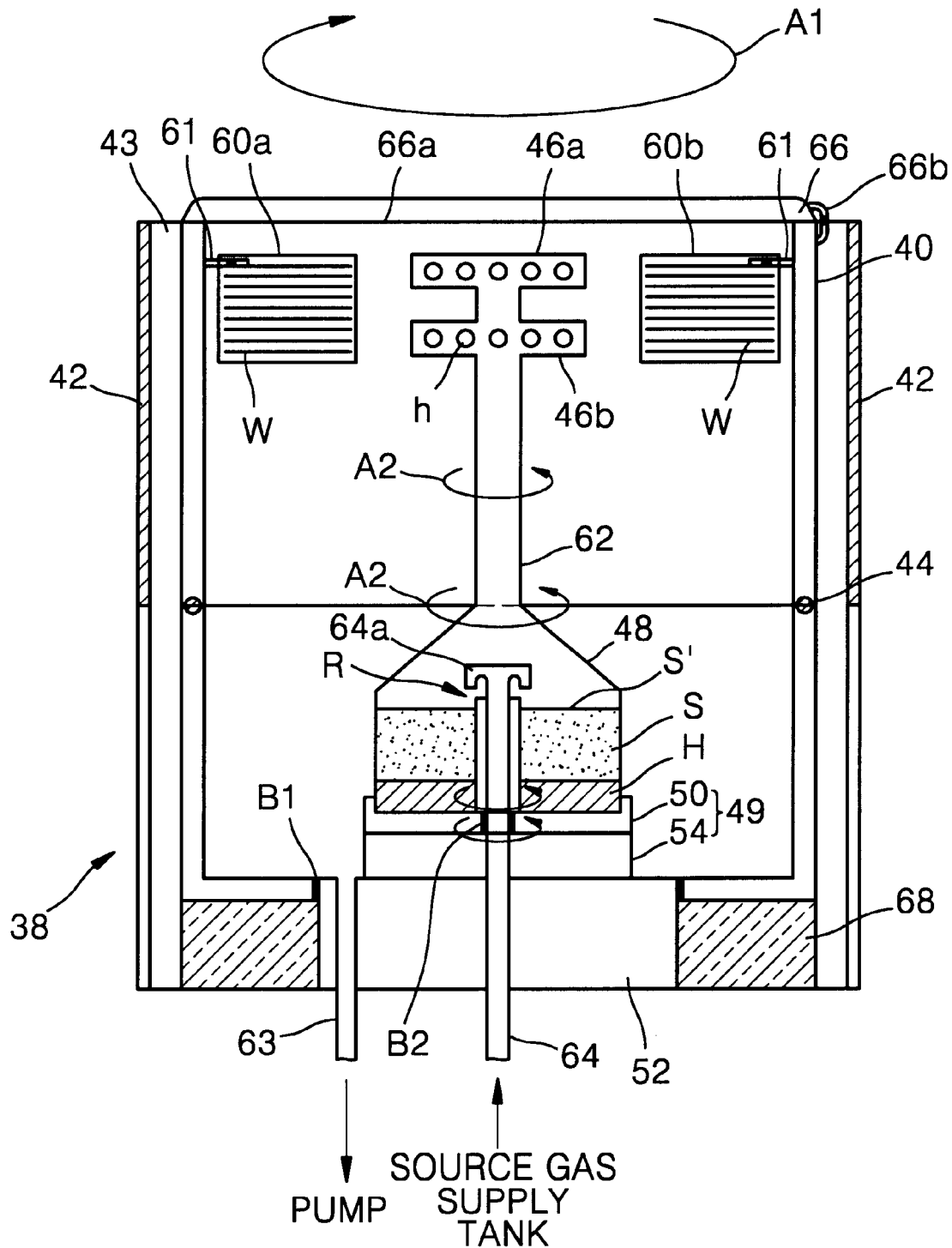
FIG. 2 is a sectional view of the wafer dryer of FIG. 1 taken along line 2—2' of FIG. 1.

Referring to FIG. 2, an opening 66a of the chamber 40 is closed with a removable cover 66. The cover 66 is connected to one side of the chamber 40 by a hinge 66b and can be selectively opened and closed. The chamber 40 is divided into an upper structure above an O-ring 44 and a lower structure below the O-ring 44. The upper and lower structures center the O-ring 44. The O-ring 44 seals the interface between the upper structure and the lower structure. An external wall 43 is mounted outside of and surrounds the chamber 40. The external heater 42 surrounds an upper portion of the external wall 43 and the upper structure of the chamber 40. Preferably, the external heater 42 is a quartz heater; however, a coil-type or other suitable heater may be used. Preferably, a protective wall (not shown) is mounted outside the external wall 43 and surrounds the entire chamber 40 and the entire external wall 43.

The revolving spray nozzle 46 is mounted below the cover 66. The revolving spray nozzle 46 is a revolving multi-layer spray nozzle and consists of an upper spray nozzle 46a and a lower spray nozzle 46b, which are connected in parallel to each other. A plurality of spray holes h are formed in the upper and lower spray nozzles 46a and 46b, as shown in FIG. 2. The revolving spray nozzle 46 is circular and the upper and lower spray nozzles 46a and 46b are shaped as hollow disks. The spray holes h are formed around the circumferential peripheries of the disks.

The first and second wafer cassettes 60a and 60b are mounted around and adjacent the revolving spray nozzle 46. The wafer cassettes 60a, 60b are connected to the chamber 40 by respective supports 61. The supports are pivotally mounted on the upper ends of the wafer cassettes 60a, 60b such that the wafer cassettes 60a, 60b may rotate upward and downward about generally horizontal axes relative to the supports 61 and, thereby, the chamber 40 and the spray nozzle 46. Before and after drying a wafer, the wafer cassettes 60a, 60b are rotated upwardly by 90 degrees about the supports 61 from the position shown in FIG. 2. The wafer cassettes 60a, 60b are positioned relative to the spray nozzle 46 such that the topmost wafers W are positioned lower than the revolving spray nozzle 46.

The source gas supply tank 48 and an internal heater H, are located in a lower part of the chamber 40 and are sequentially mounted below the revolving spray nozzle 46. The source gas supply tank 48 is adapted to supply source gas for drying the wafers W to the spray nozzle 46 and is connected to the lower spray nozzle 46b through a source gas supply pipe 62. The internal heater H contacts the bottom of the source gas supply tank 48 and heats the source gas supply tank 48 to vaporize a liquid source S with which the source gas supply tank 48 is filled. The liquid source S may be, for example, isopropyl alcohol (IPA).

A nozzle revolving unit 49 is mounted below the internal heater H. The nozzle revolving unit 49 generates torque for rotating the internal heater H and the revolving spray nozzle 46. The revolving unit 49 includes a revolving plate 50 in contact with the bottom of the internal heater H and a motor 54 in contact with the bottom of the revolving plate 50. The revolving plate 50 contacts the entire bottom of and partly surrounds the internal heater H. The revolving plate 50 transmits revolving power generated by the motor 54 to the internal heater H.

The nozzle revolving unit 49 is mounted on a fixed base 52 which is fixed in the middle of the bottom of the chamber 40. The fixed base 52 is mounted to allow independent rotation of the internal heater H and the revolving spray nozzle 46 with respect to the rotation of the chamber 40. The revolving spray nozzle 46 may thereby be rotated in the same direction as the chamber 40 or the opposite direction to that of the chamber 40.

A pumping line 63 passes through the fixed base 52 and around the revolving means 54 and connects the inside and outside of the chamber 40. The pumping line 63 is connected to a pump (not shown) for use in reducing the pressure in the chamber 40 to a near vacuum state.

In order to supply the liquid source S to the source gas supply tank 48, a liquid source supply pipe 64 passes through the bottoms of the revolving unit 49 and the source gas supply tank 48. The liquid source supply pipe 64 is connected to a liquid source supply source (not shown) outside of the chamber 40 and has a T-type end 64a extending into the source gas supply tank 48. In order to supply the liquid source while the source gas supply tank 48 is being rotated, the liquid source S is preferably supplied downwardly from a higher position than the surface level S' of the liquid source S in the source gas supply tank 48. The T-type end 64a is also positioned at a higher position than the surface level S' of the liquid source S in the source gas supply tank 48. The liquid source supply pipe 64 passes through a portion R of the bottom of the source gas supply tank 48 to prevent the liquid source S in source gas supply tank 48 from contacting the liquid source supply pipe 64. The portion R is convex and projects upwardly from the bottom of the tank 48 so that the portion R extends above the upper surface S' of the liquid source S. As a result, the portion R is positioned above other portions of the bottom of the tank 48.

With reference to FIG. 2, the chamber 40 rotates in the direction A1. The revolving spray nozzle 46 and the source gas supply tank 48 rotate in the direction A2, opposite the direction of rotation A1 of the chamber 40. A chamber revolving unit 68 for rotating the chamber 40 is secured to the bottom of the chamber 40 and is mounted around the fixed base 52. The revolving unit 68 transmits internally generated revolving power to the chamber 40.

Because the fixed base 52 is fixed, when the chamber 40 rotates, friction occurs between the two. In order to prevent or reduce frictional damage at the interface between the fixed base 52 and the chamber 40 as the chamber 40 rotates, a bearing B1 is mounted between the fixed base 52 and the bottom of the chamber 40. A bearing B2 is also mounted between the revolving plate 50 and the liquid source supply pipe 64. Holes are formed in the internal heater H so that the liquid source supply pipe 64 may pass through the middle of the internal heater H and the internal heater H does not directly contact the liquid source supply pipe 64.

Figure 3:
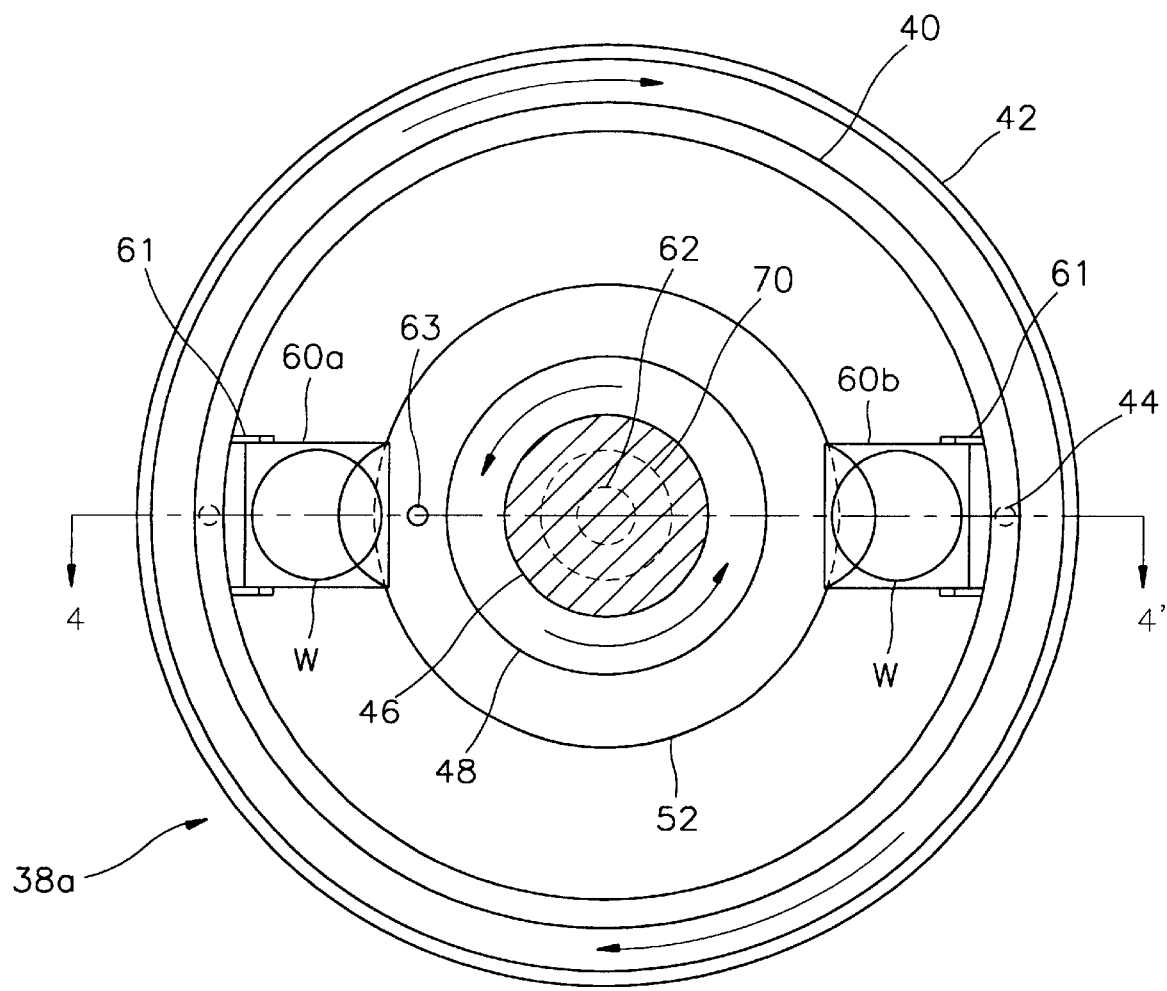
FIG. 3 is a plan view of a wafer dryer according to further embodiments of the present invention.
Figure 4:
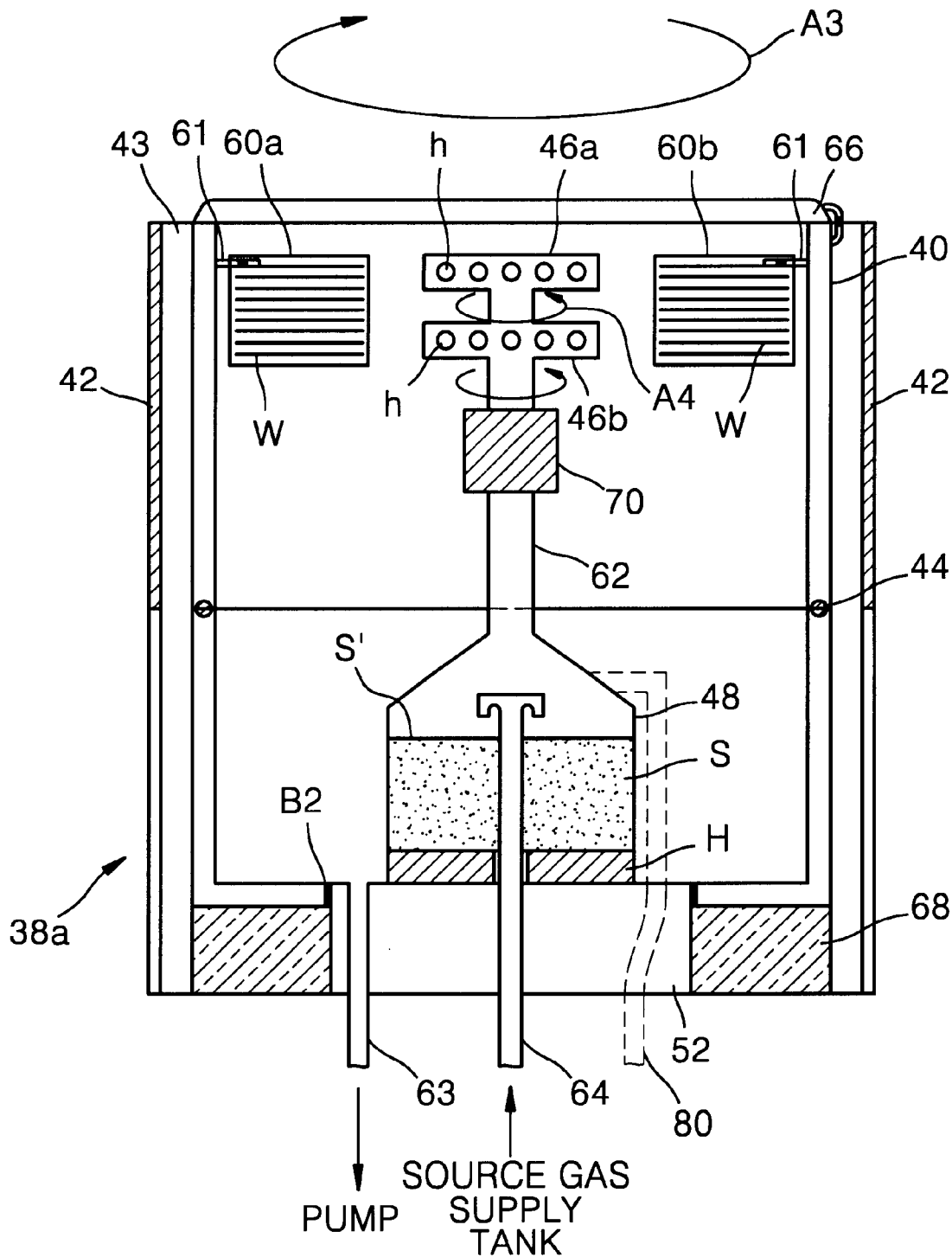
FIG. 4 is a sectional view of the wafer dryer of FIG. 3 taken along line 4—4' of FIG. 3.

With reference to FIGS. 3 and 4, a wafer dryer 38a according to further embodiments of the present invention is shown therein. The wafer dryer 38a is constructed in the same manner as the wafer dryer 38, except as described hereinbelow. The wafer dryer 38a differs from the wafer dryer 38 with respect to the rotation of the spray nozzle 46.

The wafer dryer 38a includes a revolving unit 70 for revolving the spray nozzle 46 instead of the revolving plate 50 of the wafer dryer 38. As a result, rotation of the source gas supply tank 48 is unnecessary, and accordingly, the nozzle revolving unit 49 is unnecessary.

With reference to FIG. 4, the revolving unit 70 is fixedly mounted at the source gas supply pipe 62 between the revolving spray nozzle 46 and the source gas supply tank 48. A revolving apparatus capable of revolving the revolving spray nozzle 46, for example, a motor, is mounted in the revolving unit 70, and the revolving power of the motor is transmitted only to the revolving spray nozzle 46. As a result, only the revolving spray nozzle 46 is rotated with the source gas supply pipe 48 remaining fixed. The chamber 40 rotates in the direction opposite the rotating direction of the revolving spray nozzle 46. More particularly, the direction of rotation of the revolving spray nozzle 46 is indicated by the arrow A4 and the direction of rotation of the chamber 40 is indicated by the arrow A3.

In the wafer dryer 38a, because it is not necessary to rotate the source gas supply tank 48 during the drying process, friction between the source gas supply pipe 48 and the liquid source supply pipe 64 is not a concern, and only the seal between the two need be considered. Accordingly, in the wafer dryer 38a, the source gas supply tank 48 and the liquid source supply pipe 64 are easily combined, and it is not necessary to modify the middle portion of the bottom of the source gas supply tank 48. Also, because a revolving means corresponding to the revolving unit 49 is not required, the assembly on the fixed base 52 is simplified. The internal heater H may be maintained in the same shape as in the wafer dryer 38.

Additionally, in the wafer dryer 38a, rather than passing the liquid source supply pipe 64 through the bottom of the source gas supply tank 48, the liquid source supply pipe 64 can be connected to the upper portion of the tank 48 above the liquid source S, as indicated in dashed lines and by reference numeral 80. In this configuration, because the pipe 64 does not pass through the bottom of the tank 48, the liquid source supply pipe 64 is prevented from contacting the liquid source S in the source gas supply tank 48, and it is possible to use a disk-type heater for the internal heater H rather than a brass-coin type heater.

Figure 5:
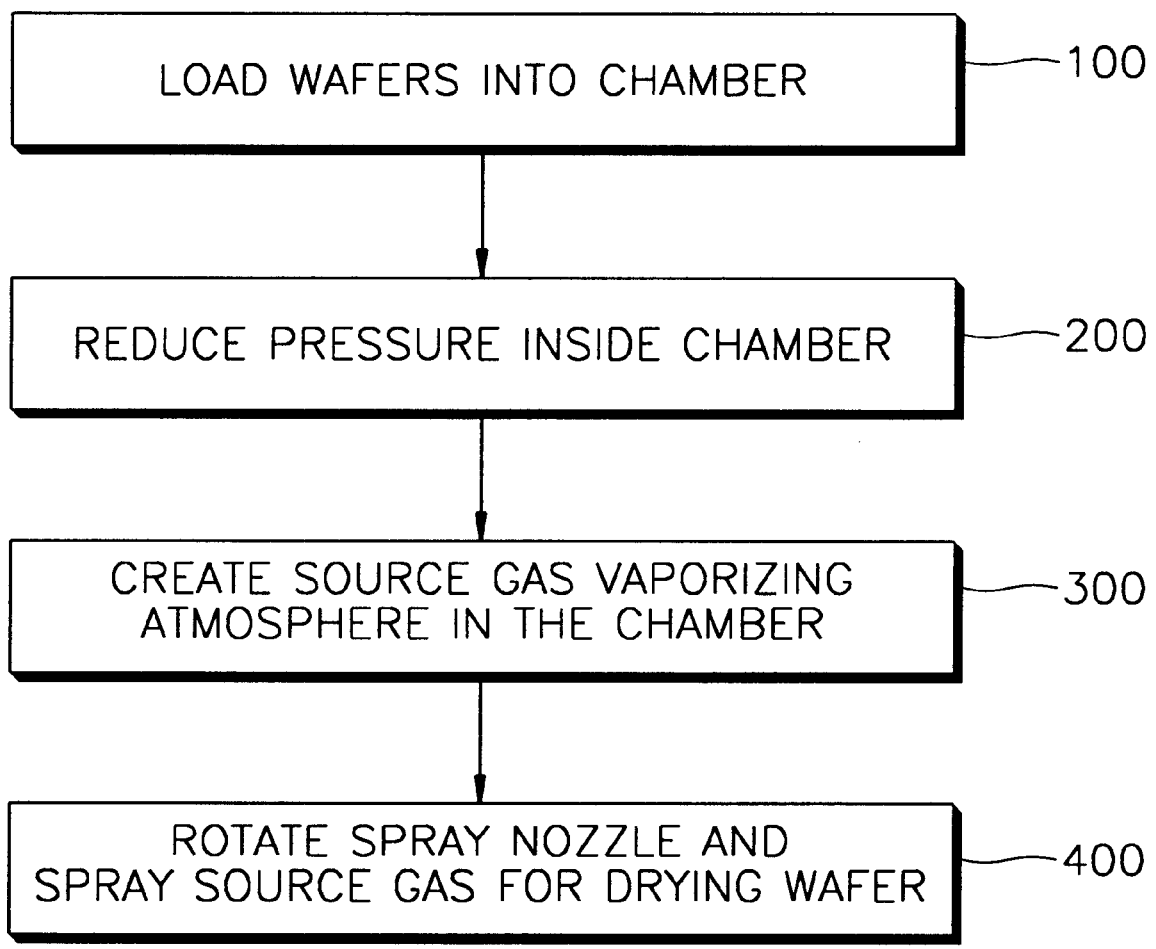
FIG. 5 is a block diagram representing a method according to the present invention for drying a wafer.

With reference to FIG. 5, the following method according to embodiments of the present invention may be used for drying a wafer using a wafer dryer according to the present invention. The method may be executed using either of the wafer dryers 38 and 38a; however, the method will be described hereinafter with reference to the wafer dryer 38a and FIGS. 3 and 4. Suitable modifications to the method to use the wafer dryer 38 will be apparent to those of ordinary skill in the art upon reading the description herein.

The wafers W are first loaded into the chamber 40 (Block 100 of FIG. 5). More particularly, the wafers W, which have preferably first undergone a cleaning process, are loaded into the first and second wafer cassettes 60a and 60b. The chamber cover 66 is opened, the first and second wafer cassettes 60a and 60b are loaded into the chamber 40 through the opening 66a and mounted on the supports 61. The chamber cover 66 is thereafter re-placed over the opening 66a to close the chamber 40.

The liquid source S is supplied from the liquid source supply source outside of the chamber 40 to the source gas supply tank 48 through the liquid source supply pipe 64, to fill the source gas supply tank 48 to an appropriate level with the liquid source S. During the drying process, the liquid source S is continuously supplied to the source gas supply tank 48 so that the level of the source gas supply tank 48 is maintained at approximately the original level. Preferably, alcohol-group chemicals having an excellent vaporizing capability are used for the liquid source S. For example, isopropyl alcohol (IPA) may be used for the liquid source S.

The pressure in the chamber 40 is then reduced to a high vacuum state by operating the pump mounted outside of the chamber 40 (Block 200 of FIG. 5).

A vaporizing atmosphere is created in the chamber 40 to prevent condensation in the chamber 40 (Block 300 of FIG. 5). More particularly, after the internal pressure of the chamber 40 is lowered to a high vacuum state, the inside of the chamber 40 is heated by operating the external heater 42. Because the external heater 42 surrounds the upper region of the chamber 40, the upper region is mainly heated. Heating the inside of the chamber 40 in this way serves to keep the source gas vaporized until the source gas supplied from the source gas supply tank 48 to the upper region of the chamber 40 completely reacts with and thereby evaporates moisture from the surfaces of the wafers W.

The chamber 40 is heated using the external heater 42 until the internal temperature of the chamber 40 reaches the temperature vaporization range of the liquid source S supplied to the source gas supply tank 48. For example, if isopropyl alcohol (IPA) is selected as the liquid source S, its range of vaporizing temperature is from about 70–90 degrees Celsius. After the internal temperature of the chamber 40 reaches the vaporizing temperature range, the chamber 40 is continuously heated until the process is complete so that the internal temperature of the chamber 40 does not drop below the vaporizing temperature range.

Thereafter, the spray nozzle 46 is rotated and the source gas is sprayed to dry the wafers W (Block 400 of FIG. 5). More particularly, after the source gas vaporizing atmosphere is created in the chamber 40, the liquid source S in the source gas supply tank 48 is heated by operating the internal heater H. The internal heater H may have a maximum heating capability of between about 20 and 300 degrees Celsius. The source gas supply tank 48 is heated at an appropriate temperature corresponding to the vaporizing temperature of the liquid source S. For example, if the liquid source S is isopropyl alcohol, the source gas supply tank 48 is preferably heated at about 70–90 degrees Celsius. The liquid source S in the gas supply tank 48 is thereby vaporized.

As the source gas supply tank 48 is heated, the chamber 40 and the revolving spray nozzle 46 are rotated by operating the revolving unit 68 and the revolving unit 70, respectively. Preferably, the chamber 40 and the revolving spray nozzle 46 are rotated in opposite directions. The source gas then flows into the rotating spray nozzle 46 through the source gas supply pipe 62 and the revolving unit 70. The drying gas is sprayed through the spray holes h and onto the wafers W in the wafer cassettes 60a, 60b.

When the revolving spray nozzle 46 is in a revolving state, the travel distance of the drying gas sprayed from the revolving spray nozzle 46 may be adjusted to accommodate the particular diameter of the wafers W by adjusting the rate of rotation (e.g., revolutions per minute (RPM)) of the spray nozzle 46. That is, when the wafers W have a relatively small diameter, the travel distance of the drying gas is reduced by lowering the rate of rotation of the revolving spray nozzle 46. When the wafers W have a relatively large diameter, the travel distance of the drying gas is increased by increasing the rate of rotation of the revolving spray nozzle 46. In this way, it is possible to dry the entireties of the wafers W loaded in the wafer cassettes 60a, 60b regardless of the diameters of the wafers W.

The drying gas sprayed onto the wafers W reacts with moisture smeared on the surface of each wafer W. The upper region of the chamber 40 in which the wafer cassettes 60a, 60b are mounted is maintained at an appropriate temperature to maintain the drying gas in the vapor state. The reaction of moisture smeared on the wafer W and the drying gas is thereby expedited. As a result, water marks left on the wafer W when moisture is vaporized are minimized or eliminated. Reaction by-products such as particles formed on the wafer W are removed by centrifugal force generated by rotation of the chamber 40.

Various modifications to the wafer dryers 38, 38a as described above may be desired. For example, various revolving spray nozzles such as a semicircle or a ring-type may be employed instead of the circular first and second revolving spray nozzles 46a and 46b, and three or more of the revolving spray nozzles may be used. Also, the technical spirit of the invention may be applied to sheet-fed dryers, in which case, the revolving spray nozzle 46 may be formed of one layer. Also, the external heater 42 may be a quartz heater or a coil-type heater surrounding the wall of the chamber 40.

In the method for drying a wafer, the travel distance of the drying gas may also be increased by increasing the spraying pressure and thereby the velocity of the spraying gas rather than adjusting the rate of rotation of the revolving spray nozzle 46. For this purpose, the diameters of the spray holes h may be reduced, or a separate pressurizing means may be provided.

As described above, the wafer dryers 38, 38a each include a revolving chamber and wafer loading means (e.g., wafer cassettes) attached to the inside of the revolving chamber and so that wafers held in the wafer loading means are rotated with the chamber. Accordingly, the reaction by-products (e.g., particles) formed on the surface of the wafer in the drying process are removed from the wafer by centrifugal force. Also, the wafer dryers each include a revolving spray nozzle which is rotated independently of the rotation of the revolving chamber and with an adjustable rotation speed. The travel distance of the drying gas sprayed from the revolving spray nozzle can be adjusted in accordance with the diameter of the wafer so that the entire wafer can be uniformly dried.

Because each of the wafer dryers also includes the external heater surrounding the upper portion of the revolving chamber, the temperature in the internal region of the chamber where the wafer is located can be maintained at an appropriate temperature for the drying gas and moisture to react during the process of drying a wafer. The efficiency of drying the entire wafer can thereby be increased, particularly for wafers of relatively large diameter.

As a result of the foregoing effects and advantages, the stability of follow-up processes such as forming metal interconnections can be ensured. For example, the reduction or elimination of reaction by-products remaining on the surface of the wafer reduces or solves the problem of undesirable bridges being formed between metal interconnections. Similarly, unintentional severing of metal interconnections formed by a photolithographic process as a result of such reaction by-products may be reduced or eliminated.

The foregoing is illustrative of the present invention and is not to be construed as limiting thereof. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The invention is defined by the following claims, with equivalents of the claims to be included therein.

That which is claimed is:

1. A wafer dryer for use with a wafer loading means, said wafer dryer comprising:

a revolving chamber having a wall, said chamber having an interior and an exterior;

a support mounted on an upper part of said wall of said chamber, wherein said support is adapted to support the wafer loading means in said chamber;

an external heater surrounding an upper portion of said exterior of said chamber and operable to heat said chamber;

a revolving spray nozzle disposed in said chamber and having a lower end;

a source gas supply tank;

a source gas supply pipe connecting said source gas supply tank to said lower end of said revolving spray nozzle;

an internal heater mounted below said source gas supply tank and operable to heat said source gas supply tank;

a fixed base disposed below said internal heater;

a pumping line which passes through said fixed base; and a chamber revolving unit operable to rotate said chamber about said fixed base.

2. The wafer dryer of claim 1 wherein said revolving spray nozzle includes upper and lower spray nozzles.

3. The wafer dryer of claim 2 wherein each of said upper and lower spray nozzles is a disk-type nozzle having spray holes formed around a circumference thereof.

4. The wafer dryer of claim 2 wherein said upper and lower spray nozzles are positioned along said source gas supply pipe.

5. The wafer dryer of claim 1 including a nozzle revolving unit operable to rotate said revolving spray nozzle, wherein said nozzle revolving unit is mounted between said revolving spray nozzle and said source gas supply tank.

6. The wafer dryer of claim 5 wherein said nozzle revolving unit is operable to selectively adjust the rate of rotation of said revolving spray nozzle to control the travel distance of said source gas.

7. The wafer dryer of claim 1 comprising a nozzle revolving unit operable to rotate said revolving spray nozzle, wherein said nozzle revolving unit is mounted between said internal heater and said fixed base.

8. The wafer dryer of claim 7 wherein said nozzle revolving unit is operable to selectively adjust the rate of rotation of said revolving spray nozzle to control the travel distance of said source gas.

9. The wafer dryer of claim 7 wherein said nozzle revolving unit includes a revolving plate in contact with said internal heater and a motor operable to rotate said revolving plate.

10. The wafer dryer of claim 7 including a liquid source supply pipe adapted to supply a liquid source to said source gas supply tank, wherein said liquid source supply pipe extends through said fixed base.

11. The wafer dryer of claim 10 wherein said liquid source supply pipe is connected to said source gas supply pipe at a location above an upper surface of said liquid source in said source gas supply tank.

12. The wafer dryer of claim 10 wherein said liquid source supply pipe is connected to the inside of said source gas supply tank and extends through said fixed base, said revolving plate, and the bottom of said source gas supply tank.

13. The wafer dryer of claim 10 wherein said internal heater is a brass coin-type heater having a heating element with a hole formed at its center such that said heating element does not contact said liquid source supply pipe.

14. The wafer dryer of claim 1 wherein said external heater is selected from the group consisting of a quartz heater and a coil-type heater.

15. A wafer dryer for drying a wafer, said wafer dryer comprising:
a chamber;
a support adapted to support the wafer in said chamber;
a spray nozzle disposed in said chamber;
a source gas supply tank in fluid communication with said spray nozzle and containing a quantity of a liquid source;
at least one heater operable to heat said liquid source in said source gas supply tank to produce a source gas;
a pumping line in fluid communication with said chamber; and
drive means operable to rotate said chamber and said spray nozzle;
wherein said spray nozzle is operative to direct said source gas from said source gas supply tank onto the wafer when the wafer is mounted on the support.

16. A wafer dryer for drying a wafer, said wafer dryer comprising:
a chamber;
a support adapted to support the wafer in said chamber;
a spray nozzle disposed in said chamber;
a source gas supply tank in fluid communication with said spray nozzle;
at least one heater operable to heat said chamber and said source gas supply tank;
a pumping line in fluid communication with said chamber; and
drive means operable to rotate said chamber and said spray nozzle;
wherein said drive means is operable to rotate said chamber and said spray nozzle in opposite directions relative to one another.

17. A wafer dryer for drying a wafer, said wafer dryer comprising:
a chamber;
a support adapted to support the wafer in said chamber;
a spray nozzle disposed in said chamber;
a source gas supply tank in fluid communication with said spray nozzle;
at least one heater operable to heat said chamber and said source gas supply tank;
a pumping line in fluid communication with said chamber; and
drive means operable to rotate said chamber and said spray nozzle;
wherein said at least one heater includes:
an external heater surrounding an upper portion of said chamber and operable to heat said chamber; and
an internal heater mounted below said source gas supply tank and operable to heat said source gas supply tank.

18. A wafer dryer for drying a wafer, said wafer dryer comprising:
a chamber;
a fixed base;
a support adapted to support the wafer in said chamber;
a spray nozzle disposed in said chamber;
a source gas supply tank in fluid communication with said spray nozzle;
at least one heater operable to heat said chamber and said source gas supply tank;
a pumping line in fluid communication with said chamber; and
drive means operable to rotate said chamber and said spray nozzle;
wherein said drive means includes:
a chamber revolving unit operable to rotate said chamber about said fixed base; and
a nozzle revolving unit operable to rotate said spray nozzle independently of said chamber.

19. A method for drying a wafer using a wafer dryer including a chamber and a revolving spray nozzle, said method comprising the steps of:
loading the wafer in the chamber;
reducing the pressure in the chamber in which the wafer is loaded to a near vacuum state;
creating a temperature controlled atmosphere in the pressure-reduced chamber to quicken drying of the wafer; and
spraying a source gas on the wafer while rotating the chamber and the revolving spray nozzle in opposite directions in the pressure-reduced temperature controlled atmosphere.

20. The method for drying a wafer of claim 19 including the steps of:
opening a cover of the chamber; and
closing the cover of the chamber after loading the wafer in the chamber.

21. The method for drying a wafer of claim 19 including the steps of:
supplying a liquid source to the source gas supply tank; and
heating the source gas supply tank to generate the source gas.

22. The method for drying a wafer of claim 21 wherein the liquid source includes alcohol-group chemicals.

23. The method for drying a wafer of claim 21 including the step of heating the source gas supply tank at 70 to 90 degrees Celsius using an internal heater.

24. The method for drying a wafer of claim 19 including the step of rotating the chamber and the revolving spray nozzle in opposite directions using independent revolving means.

25. The method for drying a wafer of claim 19 including the step of rotating the revolving spray nozzle using a nozzle revolving unit mounted in the source gas supply pipe between the source gas supply tank and the revolving spray nozzle.

26. The method for drying a wafer of claim 19 including the step of rotating the revolving spray nozzle together with the source gas supply tank.

27. The method for drying a wafer of claim 26 including the step of rotating the source gas supply tank using a chamber revolving unit, the chamber revolving unit including a motor mounted below the source gas supply tank.

28. The method for drying a wafer of claim 19 including the step of heating a wafer loading region of the chamber using an external heater mounted outside of the chamber so as to create the temperature controlled atmosphere.

29. The method for drying a wafer of claim 28 including the step of heating the wafer loading region of the chamber to between about 70 and 90 degrees Celsius using the external heater.

30. The method for drying a wafer of claim 19 including the step of adjusting the rate of rotation of the revolving spray nozzle to select the travel distance of the source gas.

31. The method for drying a wafer of claim 19 wherein the wafer dryer further includes a source gas supply tank and a source gas supply pipe connected below the revolving spray nozzle for supplying source gas to the revolving spray nozzle.

* * * * *